United States Patent [19]
Hui Bon Hoa et al.

[11] Patent Number: 5,272,559
[45] Date of Patent: Dec. 21, 1993

[54] TRUNCATED FREQUENCY DISCRIMINATOR

[75] Inventors: Daniel Hui Bon Hoa, Lannion; Michel Condom, Trebeurden; André Tromeur, Louannec, all of France

[73] Assignee: France Telecom Etablissement Autonome de Droit Public, Paris, France

[21] Appl. No.: 933,199

[22] Filed: Aug. 21, 1992

[30] Foreign Application Priority Data

Sep. 9, 1991 [FR] France .................. 91 11102

[51] Int. Cl.$^5$ .................. H04L 27/14; H04B 9/00; H03D 3/26
[52] U.S. Cl. .................. 359/191; 359/192; 455/313
[58] Field of Search .................. 359/191, 192; 455/313, 455/227; 328/141; 307/519

[56] References Cited

U.S. PATENT DOCUMENTS

| | | | |
|---|---|---|---|
| 3,882,397 | 5/1975 | Konishi | 325/449 |
| 4,630,054 | 12/1986 | Martinson | 342/20 |
| 5,069,210 | 12/1991 | Jeutter et al. | 455/41 |
| 5,081,424 | 1/1992 | Tresselt | 329/302 |

Primary Examiner—Nelson Moskowitz
Attorney, Agent, or Firm—Oblon, Spivak, McClelland, Maier & Neustadt

[57] ABSTRACT

A truncated frequency discriminator according to the present invention features an amplifier (A), phase adjustment circuits (CAP1, CAP2) and circuitry (V1, V2) for very weakly forward polarizing Schottky diodes (DS1, DS2). Such a truncated frequency discriminator allows for a reduced noise and may find particular application in optical telecommunications receivers.

1 Claim, 2 Drawing Sheets

TRUNCATED FREQUENCY DISCRIMINATOR

TECHNICAL FIELD

The present invention relates to a truncated frequency discriminator. It is used in telecommunications and in particular optical telecommunications, where it makes it possible to produce coherent receivers.

PRIOR ART

A frequency discriminator is a circuit, which converts a frequency-modulated signal into an amplitude-modulated signal. Such a circuit is defined by its transfer characteristic, which represents the variation of the voltage of the output signal as a function of the frequency of the input signal.

Such circuits are used in heterodyne reception. The frequency-modulated incident signal is firstly mixed with a local signal of different frequency, which leads to a signal at an intermediate frequency, which is the beat frequency. This frequency is generally at a few gigahertz. The intermediate frequency signal then undergoes a frequency demodulation with the aid of a discriminator.

The general structure of a frequency discriminator is shown in the attached FIG. 1. It comprises a general input E, a coupler C having an input Ce and a first and a second output Cs1, Cs2, a first channel connected to the first output Cs1 and a second channel connected to the second output Cs2, a delay circuit CAR located in the second channel, a mixer M having a first and a second input Me1, Me2, the first input Me1 being connected to the first channel and the second input Me2 being connected to the second channel and an output Ms. The general output S of the discriminator supplies a voltage, whose amplitude reflects the frequency variations of the beat signal.

A general description of such circuits is provided in the article by T. G. HODGKINSON et al entitled "Coherent optical fibre transmission systems", published in the journal Br. Telecom. Technol. J., vol. 3, No. 3, pp 5-18, July 185, or in the article by I. GARRETT et al entitled "Theory of optical heterodyne narrow-deviation FSK receivers with delay demodulation", published in J. Lightwave Technol., vol. LT-6, September 1988, pp 1415-1423, or in the article by H. TSUSHIMA et al entitled "AMI-CPFSK heterodyne transmission experiment using a novel delay-line demodulation method", published in Electronics Letters, Aug. 2, 1990, vol. 26, No. 16, pp 1269-1270.

In practice, the mixer receiving the two signals delayed with respect to one another is constituted by two, series-connected, non-polarized Schottky diodes having a center point connected to the general output. Such a circuit leads to a quasi-sinusoidal transfer characteristic. The abscissas of the maximum (f2) and the minimum (f1) of the response curve are dependent on the time lag and the phase shift between the outputs of the separator and the inputs of the mixer.

In the vicinity of the discriminator tuning frequency fo, the transfer characteristic is linear, i.e. the output voltage variation $\Delta Vo$ is proportional to the frequency variation $\Delta fo$ of the input signal with a significant slope $\Delta Vo/\Delta fo$.

In the case of optical telecommunications systems using laser diodes, the emission frequencies suffer from a very significant phase noise leading to a spectra width of the emission line of a few megahertz to a few dozen megahertz. In heterodyne reception, a beat signal is obtained, whose spectral width in the absence of modulation is the sum of the spectral widths of the local oscillator and emitter lasers. When this beat frequency is tuned to the tuning frequency fo of the discriminator, the latter converts the phase noise of the lasers into amplitude noise and very high noise voltage fluctuations are obtained at the discriminator output.

In general, the emitter laser is modulated by frequency shift keying (FSK) with e.g. a binary code, so that the beat frequency remains in the linear range centered around the discriminator tuning frequency fo. This then leads to a conversion of the phase noise into amplitude noise.

DESCRIPTION OF THE INVENTION

The present invention aims at obviating this disadvantage. To this end, it proposes modifying the known discriminators in such a way that the frequency-voltage characteristic is truncated, i.e. has at the upper and lower ends a wide horizontal range where a variation $\Delta f1$ of f1 (respectively $\Delta f2$ of f2) corresponds to a variation $\Delta v1$ (respectively $\Delta v2$) of the output voltage which is very small compared with $\Delta vo$.

In addition, the frequency of the beat signal assumes the value f1 corresponding to the state 0 or the value f2 corresponding to the state 1. It will therefore be located in one or other of the two truncated regions of the transfer characteristic and consequently the conversion of the phase noise into amplitude noise will be very limited. Following the truncated discriminator, a much smaller noise voltage will be collected than with the prior art discriminators.

During the transitions between the frequencies f1 and f2, the beat signal will pass through the linear zone and the discriminator will then supply a high noise voltage. However, these transient states are short compared with the duration of states 0 and 1 and their contributions to the total noise voltage must be weighted in time.

The resulting noise voltage will be reduced compared with that supplied by an untruncated discriminator and everything will take place as if the effective spectral width due to the characteristic of the truncated discriminator was reduced by a factor between 3 and 5 compared with the spectral width of the beat signal before the truncated discriminator.

The truncated frequency discriminator according to the invention makes it possible to use laser diodes having much greater line widths than in the prior art. For example, with a conventional discriminator, it is necessary to have a beat line width below 0.5% of the digital flow to obtain an error rate of $10^{-9}$ for a FSK modulation. In the case of the truncated discriminator according to the invention, the inventors have experimentally established that the beat line width could be increased to 3.5% of the digital flow for an error rate of $10^{-10}$. This tolerance increase permits the use of laser diodes having a less stringent phase noise specification and which can be manufactured more economically.

Another advantage provided by the truncated characteristic is its greater immunity to a non-uniform frequency modulation response of the laser diode. When the latter is modulated by a constant amplitude current, the deviation of the optical frequency is not constant and instead varies in accordance with the frequency of the modulation current. A linear frequency discriminator reproduces the deviations of the beat frequency and gives an output voltage with an irregular amplitude dependent on the modulating signal. In order to reduce this distortions, it is possible to compensate the frequency modulation response of the laser diode. The correction function is highly dependent on the sample, the temperature, the polarizing current, etc. It is subject to too many risks to enable a perfect correction to be obtained. A second means for reducing voltage distortions supplied by the linear discriminator is to clip the amplitudes. This is the function of the truncated discriminator according to the invention, provided that the frequencies corresponding to states 0 and 1 are in truncated ranges. The frequency deviations around f1 and f2 are then converted into voltage deviations with very low amplitudes, so that they remain within the limits of the truncated ranges. As the latter are wider than in the case of a conventional frequency discriminator, the truncated discriminator has a greater immunity to the non-uniform response of the laser diodes in frequency modulation.

Comparative measurements performed on a 140 Mbit/s system with a linear discriminator and a truncated discriminator have revealed that the error rate was reduced to $5.10^{-10}$ (i.e. an improvement by a factor of 500) with a pseudo-random test sequence of 127 bits.

All these results are achieved by the invention by giving the discriminator supplementary means making it possible to adjust the amplitude and phase of the different signals, while also adjusting the operating point of the Schottky diodes. According to the invention, the coupler is preceded by a power amplifier, each channel being provided with a phase adjustment circuit, the two Schottky diodes being associated with circuits making it possible to very slightly forward polarize them and the beat frequency assumes the value f1 or f2, said frequencies being located in truncated ranges.

DETAILED DESCRIPTION OF AN EMBODIMENT

Figure 1:
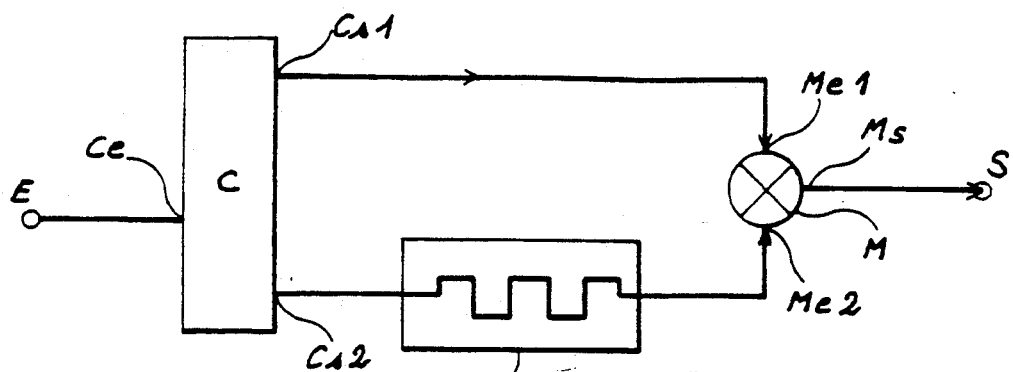
FIG. 1, already described, shows the general diagram of a discriminator.
Figure 2:
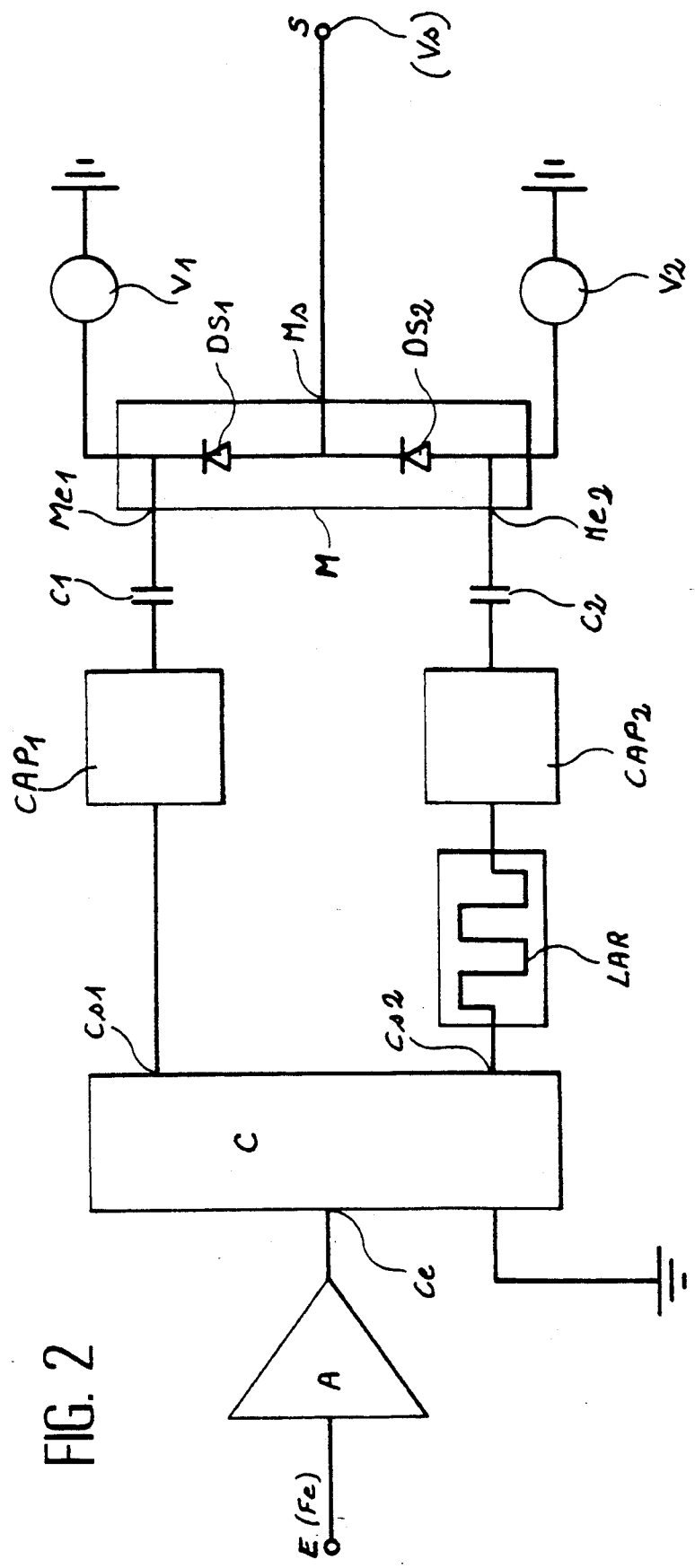
FIG. 2 shows a truncated discriminator according to the invention.

The frequency discriminator shown in FIG. 2 comprises means already shown in FIG. 1, namely a general input E, a coupler C having an input Ce and a first and a second output Cs1, Cs2, a first channel connected to the first output Cs1 and a second channel connected to the second output Cs2, a delay circuit CAR located in the second channel, a mixer M having a first and a second inputs Me1, Me2, the first input Me1 being connected to the first channel and the second input Me2 being connected to the second channel. This mixer is constituted by a first Schottky diode DS1 connected to the first channel and by a second Schottky diode DS2 connected to the second channel, said two diodes being connected in series and have a center point Ms connected to the general output S of the discriminator.

The discriminator of FIG. 2 is also characterized in that it comprises:

a power amplifier A positioned between the general input E and the coupler C, in the first channel, a phase adjustment circuit CAP1 followed by a first connecting capacitor C1, in the second channel, a second phase adjustment circuit CAP2 followed by a second connecting capacitor C2, a first polarizing circuit of the first Schottky diode having a first regulatable voltage source V1 able to weakly forward polarize the first diode DS1, a second polarizing circuit of the second Schottky diode having a second regulatable voltage source V2 able to weakly forward polarize the second diode DS2.

In order to obtain the truncated transfer characteristic, it is necessary that the power amplifier A can supply an unmodulated signal of at least +7 dBm. The delay supplied by the circuit CAR is determined as a function of the flow rate of the digital signal frequency modulating the emitter laser. The two phase adjustment circuits CAP1 and CAP2 make it possible to tune the frequencies f1 and f2 to the horizontal ranges of the transfer characteristic.

The two polarization circuits are constituted by regulatable voltage sources having a source impedance L, R and are connected in one case to the anode of one of the Schottky diodes and in the other to the cathode of the other diode. The voltages supplied polarize the diodes in the forward direction with very weak potentials of a few dozen millivolts at the terminals of each of them. The potential adjustments are such that the truncation of the transfer characteristic is obtained with flat maximum and minimum amplitudes on either side of the 0 volt level.

The gain of the amplifier A can be automatically regulated to the appropriate value by a not shown, automatic gain control circuit, which reloops the output of the amplifier to a gain regulating input of said amplifier.

Figure 3:
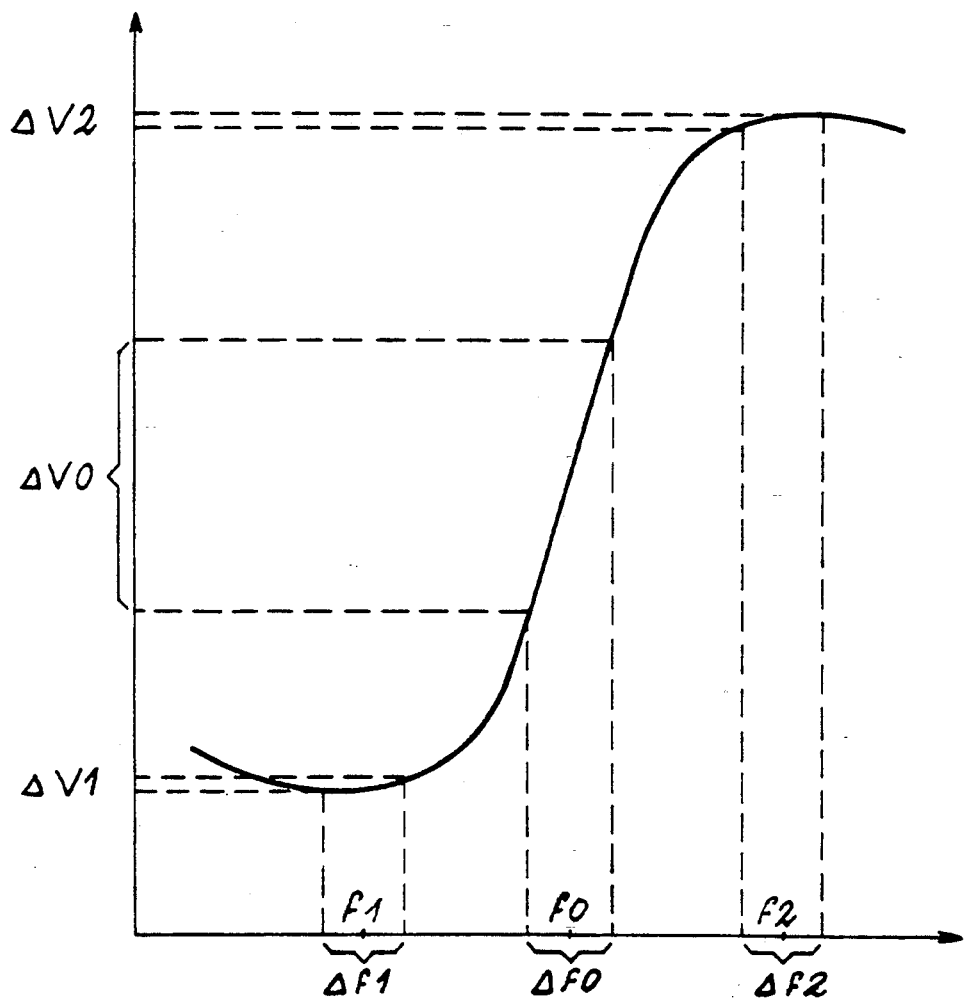
FIG. 3 shows the transfer characteristic of the discriminator according to the invention.

The typical transfer characteristic obtained is illustrated in FIG. 3. The frequency of the input signal Fe is plotted on the abscissa and the output voltage Vs on the ordinate. The value fo designates the tuning frequency, f1 the lower frequency, f2 the upper frequency, while $\Delta$f1 designates the frequency variation around the lower frequency and $\Delta$f2 the frequency variation around the upper frequency. $\Delta$vo is the voltage variation corresponding to a frequency variation $\Delta$fo around the tuning frequency and $\Delta$v1 and $\Delta$v2 are voltage variations at the ends of the characteristic.

We claim:

1. A frequency discriminator comprising:

an input means;

a coupler having an input and a first and second output;

a first channel connected to the first output of the coupler;

a second channel connected to the second output of the coupler;

a delay circuit located in the second channel;

a mixer having a first and a second input, the first input being connected to the first channel and the second input being connected to the second channel, said mixer comprising a first Schottky diode connected to the first channel and a second Schottky diode connected to the second channel, said two diodes being connected in series and having a center point connected to an output of the frequency discriminator;

an amplifier connected between the input means and the input of the coupler;

a first phase adjustment circuit located in the first channel;

a second phase adjustment circuit located in the second channel;
a first polarizing circuit connected to the first Schottky diode and having a first regulatable voltage source to forward polarize the first diode;
a second polarizing circuit connected to the second Schottky diode and having a second regulatable voltage source to forward polarize the second diode;

wherein the amplifier, the first and second phase adjustment circuits, and the first and second polarizing circuits are adjusted to that the discriminator has a transfer characteristic with two flat ends.

* * * * *